(12) United States Patent
Mimken

(10) Patent No.: US 7,993,093 B2
(45) Date of Patent: Aug. 9, 2011

(54) SYSTEMS AND METHODS FOR WAFER TRANSLATION

(75) Inventor: Victor Mimken, Boise, ID (US)

(73) Assignee: Applied Materials, Inc., Santa Clara, CA (US)

( * ) Notice: Subject to any disclaimer, the term of this patent is extended or adjusted under 35 U.S.C. 154(b) by 1741 days.

(21) Appl. No.: 10/941,600

(22) Filed: Sep. 15, 2004

(65) Prior Publication Data

US 2006/0104795 A1  May 18, 2006

(51) Int. Cl.
*B07C 1/18* (2006.01)

(52) U.S. Cl. .......................................... 414/763; 414/936

(58) Field of Classification Search .................. 414/763, 414/805.6, 816, 936, 938, 941; 901/31, 28, 901/2; 74/490.04; 294/106, 99.1, 86.4
See application file for complete search history.

(56) References Cited

U.S. PATENT DOCUMENTS

| | | | | |
|---|---|---|---|---|
| 4,715,637 A * | 12/1987 | Hosoda et al. | ................ | 294/86.4 |
| 4,778,332 A * | 10/1988 | Byers et al. | ................... | 414/735 |
| 5,040,484 A | 8/1991 | Mears et al. | | |
| 5,096,364 A | 3/1992 | Messer et al. | | |
| 5,615,988 A | 4/1997 | Wiesler et al. | ................ | 414/416 |
| 5,702,228 A * | 12/1997 | Tamai et al. | ................ | 414/744.5 |
| 6,132,165 A * | 10/2000 | Carducci | ..................... | 414/744.5 |
| 6,167,322 A * | 12/2000 | Holbrooks | ..................... | 700/112 |
| 6,592,324 B2 * | 7/2003 | Downs et al. | ..................... | 414/741 |
| 6,614,201 B2 * | 9/2003 | Saino et al. | ............. | 318/568.11 |
| 6,618,645 B2 * | 9/2003 | Bacchi et al. | .................. | 700/254 |
| 6,726,848 B2 | 4/2004 | Hansen et al. | ................ | 216/109 |
| 6,729,462 B2 * | 5/2004 | Babbs et al. | ................ | 198/346.2 |
| 2004/0037690 A1 * | 2/2004 | Kubo et al. | .................... | 414/741 |
| 2005/0006916 A1 * | 1/2005 | Mantz | ......................... | 294/103.1 |

FOREIGN PATENT DOCUMENTS

| | | |
|---|---|---|
| JP | 2000-260858 | 9/2000 |
| JP | 2004-055697 | 2/2004 |
| SU | 1158760 A * | 5/1985 |
| WO | WO-00/02808 | 1/2000 |

OTHER PUBLICATIONS

International Search Report and Written Opinion for PCT/US2005/032945 Dated Jun. 6, 2006.

* cited by examiner

*Primary Examiner* — Joshua I Rudawitz

(74) *Attorney, Agent, or Firm* — Patterson & Sheridan, L.L.P.

(57) ABSTRACT

A two-axis automation system can be used to transfer and rotate wafers between horizontal and vertical orientations necessary for differing steps in a semiconductor fabrication process. The two rotational axes allow for the transfer and rotation to be done in a minimal space and with a minimum amount of swept volume. A transfer arm of the automation system can include a pair of load pads capable of loading and unloading a wafer processing chamber in a single sweep.

26 Claims, 12 Drawing Sheets

SYSTEMS AND METHODS FOR WAFER TRANSLATION

TECHNICAL FIELD OF THE INVENTION

The present invention relates to the translation of wafers in an automated wafer processing system.

BACKGROUND

In the fabrication of semiconductor wafers, it is often necessary to change the orientation of a silicon wafer as the wafer is translated between processing stations and/or from a wafer carrier. In some processing applications, for example, a wafer is dipped into a number of vertical processing chambers and/or stations, such as for megasonic cleaning, even though other processes such as deposition and lithography may require the wafer to be in a horizontal orientation. Vertical chambers that can be used to perform one or more of these surface processing and preparation steps are described, for example, in U.S. Pat. No. 6,726,848, entitled "APPARATUS AND METHOD FOR SINGLE SUBSTRATE PROCESSING," filed Dec. 7, 2001. As horizontal orientation is presently the standard, since wafers typically come in a FOUP as known in the art, it becomes necessary for the automation mechanisms of the processing system to rotate the wafers between horizontal and vertical orientations as needed during transfer. In many of these processing systems, the large chambers used to transfer and orient wafers pose a number of problems, such as the need for complex transfer devices and elevator mechanisms that require a significantly larger volume than otherwise would be necessary. Currently, six axis robots are used that occupy a relatively large space and have an undesirable amount of complexity. In addition to occupying additional space on the floor of the fab, the larger internal volume leads to longer purge cycles necessary to remove potential contaminants such as moisture and oxygen. These longer purge cycles result in a decrease in system throughput. The use of complex transfer mechanisms and elevator mechanisms also reduces system uptime, and further increases the risk of contamination due to the generation of particles during movement of the transfer components.

The cost of processing semiconductor wafers is often evaluated by the amount of throughput per unit cost, as well as the throughput per square area of floor space used for the processing apparatus. Therefore, a processing system with a larger overall footprint is considered to have a higher cost per area. Another cost factor is the capital cost of the equipment, which increases as the apparatus becomes more complex.

DETAILED DESCRIPTION

Systems and methods in accordance with embodiments of the present invention can overcome various deficiencies in existing wafer transfer and orientation mechanisms by providing a simple and compact two-axis robot capable of precisely and efficiently transferring and rotating wafers between a horizontal and vertical orientation. One such automation package can take a wafer from a horizontal stage, for example, and transfer that wafer to a vertical wafer processing station in a minimum amount of space and with minimal complexity.

Figure 1:
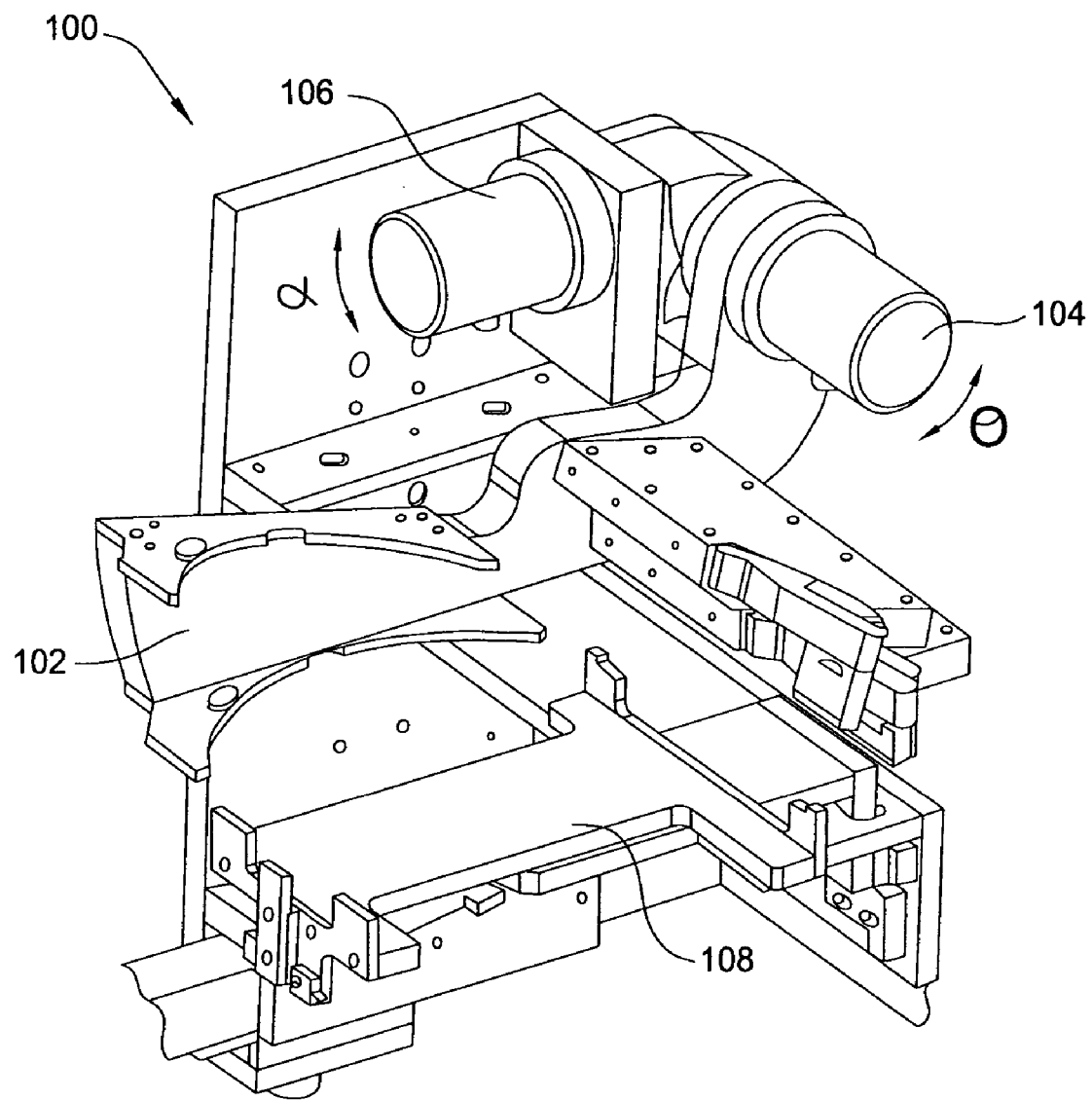
FIG. 1 is a perspective view of a wafer transfer mechanism that can be used in accordance with one embodiment of the present invention.

An automation system 100 in accordance with one embodiment of the present invention is shown in the perspective view diagram of FIG. 1. This exemplary automation system utilizes a basic two-motion approach, defined by a first or "shoulder" rotation mechanism 106 and a second or "wrist" rotation mechanism 104. These rotation mechanisms can be comprised of any appropriate rotation-capable devices known or used in the art, such as a model SHF-2UH-14 zero backlash, high accuracy harmonic drive speed reducer, available from HD Systems of Hauppauge, N.Y., in combination with a model IB23810-q1 brushless servo motor from MCG, Inc. of Eden Prairie, Minn. The motor can be controlled by a motion control device, such as those provided by Galil Motion Control Inc. of Rocklin, Calif.

Using a two-motion approach can require significantly less swept volume than a six-axis robot to transfer a wafer between a horizontal and a vertical orientation, minimizing both the footprint of the transfer mechanism and the amount of necessary swing space. As known and used in the industry, "swept volume" refers generally to the volume of space generated (or occupied over time) by the motion of an object such as a robot arm or transfer assembly along a specific path, including any rotation(s) of the object. A workpiece, such as a 300 mm silicon wafer, can initially be placed on a table 108 or support structure. The wafer can be placed on this support structure using any of a number of automation and transfer mechanisms known and/or used in the art. A transfer arm 102 of the automation system can grasp the wafer on the support structure 108, such that a rotation of the arm by the shoulder rotation mechanism 106 can transfer and rotate the wafer from a substantially horizontal orientation to a substantially vertical orientation along rotation angle α, where α typically rotates between 0° and 90° with respect to the vertical axis. Once in a vertical orientation, or at least once the wafer is clear of any obstruction capable of damaging the wafer, the wrist rotation mechanism 104 can transfer the vertically-oriented wafer to an appropriate location relative to a single wafer processing station along rotation angle θ, where θ typically will rotate about 90° with respect to the initial orientation shown in FIG. 1, although the wrist rotation mechanism 104 can rotate up to a full 360° where necessary. In many systems, however, a full 360° rotation will not be used in order to minimize the swept volume. Such an automation system can be operable in vacuum and/or atmospheric process systems. The automation system can be made relatively inexpensively for atmospheric processes using aluminum or plastic materials, while ceramic and stainless steel materials that do not outgas can be used for vacuum processes. While described with respect to an initially horizontal wafer, it should be recognized that such an automation system also can be used to accept a wafer or workpiece that initially is at another orientation, and can transfer and rotate the wafer as needed for the processing system.

Figure 2:
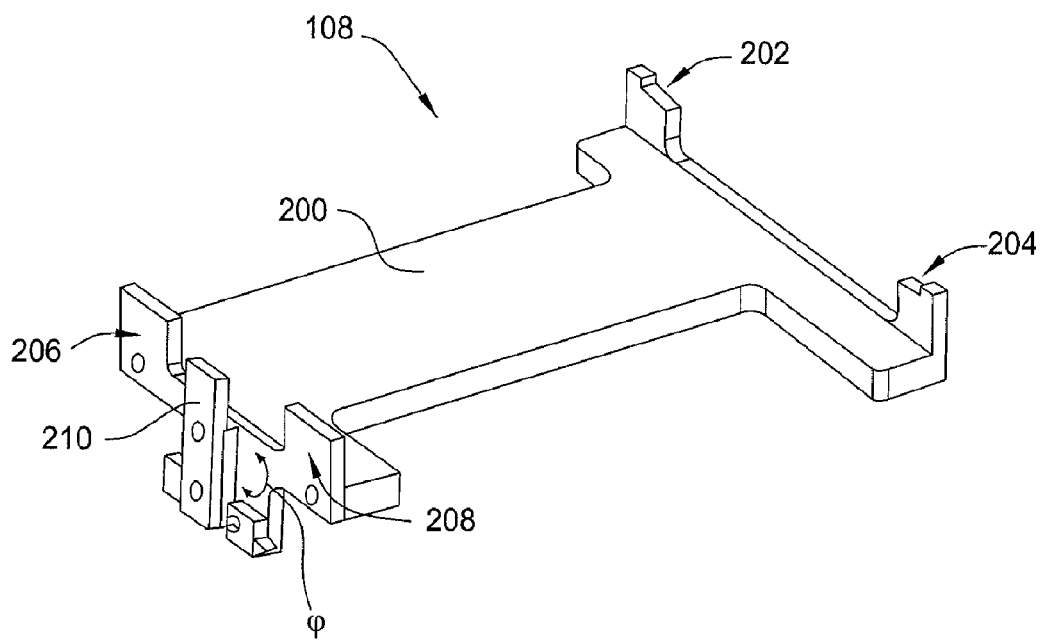
FIG. 2 is a perspective view of the slide table of FIG. 1.

FIG. 2 shows the support structure 108 of FIG. 1, which in this example takes the form of a slide table. Reference numbers are carried over between Figures where appropriate, for simplicity. This slide table has a substantially planar body portion 200, which is approximately the same length as the diameter of the wafers to be processed and typically will be in a substantially horizontal orientation. The planar body 200 can be relatively thin, allowing for a reduction in weight and material cost while still providing ample support for each wafer. At a first end of the planar body 200 are located first and second substantially vertical support members 202, 204. Each of these support members 202, 204 is notched at the top or wafer supporting surface so as to provide vertical support for a wafer while providing wafer guides or stops in the horizontal direction. At a second end of the planar body are located third and fourth substantially vertical support members 206, 208. These support members 206, 208 can have substantially horizontal and planar upper edges, in order to provide vertical support for a wafer without limiting motion of the wafer in the horizontal direction. A latching device is also positioned at the second end of the planar body 200, which includes a latching member 210 capable of moving to engage the wafer, such as by a horizontal and/or vertical translation, or through pivoting about an angle φ defined by a flexible hinge, pin assembly, or other rotational mechanism positioned near latching member 210. The latching member 210 can move away from the planar body in order to allow a wafer or workpiece to be positioned on the support members 202, 204, 206, 208 without risking damage to the wafer due to slight positioning errors. Once the wafer is positioned on the support members, the latching member 210 can move back toward the planar body in order to press the wafer against the notches of the first and second support members 202, 204, so as to register the wafer, as well as to provide a third vertical stop or guide for the wafer, thus providing for an accurate and repeatable positioning of the wafer. Latching member 210 can include an extended piece or "flag" member that is capable of interacting with a photogate on a sensor of the latching member assembly. When the latching member has engaged a wafer, the latching member will be in a very precise location such that the flag can be configured to interrupt the photogate. When the latching member 210 is positioned away from the wafer, or has attempted to engage a wafer but has passed beyond where the edge of the wafer would otherwise reside, the flag will not interrupt the photogate as the flag will be positioned a distance from the photogate, such that the system can know that the latching member has not properly engaged a wafer.

The three vertical stops allow the wafer to be translated by the slide table 108, typically along a horizontal slide path, without risk of the wafer sliding off the table. The latching member 210 can move away from the planar body in order to disengage from the wafer, such that the wafer can be removed by the wafer transfer mechanism of FIG. 1 or by another automation system capable of transferring wafers to and from the slide table. The latching mechanism can be driven and controlled using any appropriate mechanisms known and/or used in the art, such as a precision glass-lined pneumatic AIRPEL® cylinder actuator available from Airpot Corporation of Norwalk, Conn. Such an actuator can also be used to control the gripping mechanisms of the actuator arm and the movement of the slide table.

Figure 3:
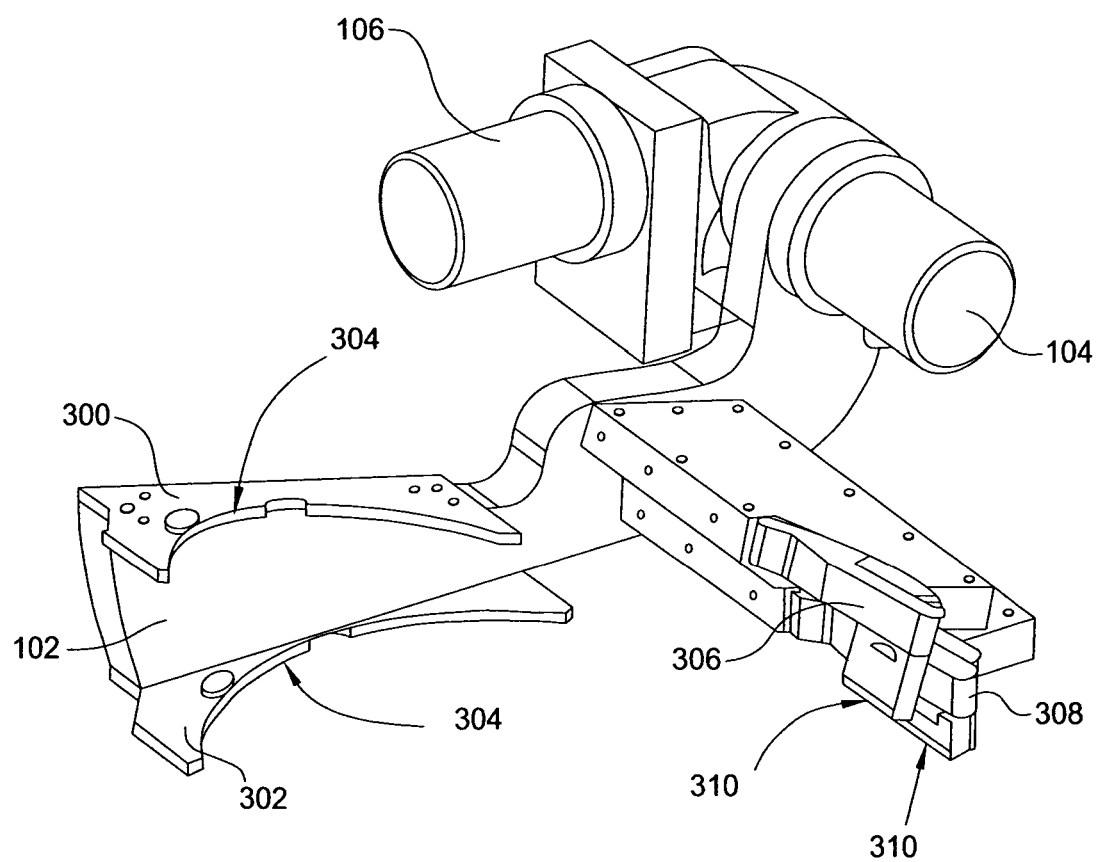
FIG. 3 is a perspective view of the wafer transfer arm of FIG. 1.

FIG. 3 shows the transfer arm assembly 102 of FIG. 1. The arm can be a straight arm, or can be bent such as in an "L" shape in order to accommodate the shape of existing process equipment, and/or to minimize the amount of change to the existing arrangement. For instance, the process chamber may be positioned higher than a load station in order to accommodate plumbing that goes below the chamber. It also may be desirable to position the load plane within a working range of the FOUP, whereby standard automation equipment can be used to load the pad. In such a situation, a bent arm assembly can be an easy and acceptable solution. Placing an L-shape or bend in the arm can change the pivot point of the wafer in the system, however, such that some adjustments may need to be made as would be understood to one of ordinary skill in the art.

At the end of the transfer arm opposite the rotation mechanisms 104, 106 is a pair of load pads 300, 302. The load pads are angled with respect to one another such that when the transfer arm is rotated by the wrist rotation mechanism 104, each pad will have the same orientation when passed over a specific point in the rotation. The angle between the load pads 300, 302 can be as small as possible, in order to reduce the amount of necessary material and/or the amount of swept volume, but can be large enough that no part of the processing system that contacts a wafer in one of the load pads can damage a wafer in the other load pad. In one example, the skew angle between the load pads is approximately 15°.

Each load pad 300, 302 has a circular edge on one side, shaped to receive a disc-shaped wafer. Each of these circular sides can have a notch, lip, or groove formed therein, such as a rounded or a "V"-shaped groove, as well as a substantially "V"-shaped groove having a rounded apex therein, which allows a wafer to be grasped by the edge such that the wafer is supported in both the horizontal and vertical directions. These grooves along the circular edges of the load pads shall be referred to herein as combs 304. The combs can be designed to minimize wafer contact while providing sufficient support to prevent slippage of the wafer.

Also positioned on the arm 102 are first and second gripping mechanisms 306, 308 capable of releasably contacting an edge of wafer being held by a respective one of said load pads 300, 302. Each of these gripping mechanisms 306, 308 has a notch or groove 310 similar to that of the load pads, such that the wafer can be supported in both the horizontal and vertical directions. The gripping mechanisms 306, 308 can be positioned opposite a portion of the load pads 300, 302 with respect to the wafer, such that each wafer is held on opposite sides to prevent slippage when the wafer is translated and/or rotated.

In other embodiments, the transfer arm might not use gripping mechanisms at all. In such a case, the load pads might be configured to pinch or grab the edge of the wafer, outside the edge exclusion zone, so as to secure the wafer. In another embodiment, a vacuum port or other mechanism known for securing a wafer can be used to hold the wafer to the transfer arm, such that load pads and/or gripping mechanisms are not necessary. These embodiments may not be as favorable to certain manufacturers and/or customers, however, as it is generally considered undesirable to grab a wafer at any position except the edge. Further, it can be difficult in some systems to hold a wafer in place during rotation and translation with a vacuum port, as any amount of debris or contamination can break the vacuum seal, causing the wafer to fall from the transfer arm.

Each of the rotational mechanisms 104, 106 can rotate the transfer arm using any appropriate rotational mechanisms known or used in the art. For example, each of the rotational mechanisms can include a compact, precision harmonic gear box, servo motor, and control device capable of precisely and repeatably rotating the transfer arm. The shoulder rotation mechanism 106 can precisely transfer a wafer from a horizontal to a vertical orientation, while the wrist rotation mechanism 104 can swing the vertically-oriented wafer over a processing chamber, for either or both of the load pad positions.

A number of sensors can be used to prevent damage to wafers being loaded into, or unloaded by, the automation system. For example, a sensor such as a convergent reflective type sensor or through-beam type sensor can be used with the load pads 300, 302 and/or the gripping mechanisms 306, 308. These sensors can be used to tell when a wafer is located sufficiently within a groove, for example, or to determine whether one of the gripping mechanisms has sufficiently disengaged and/or fully retracted from the wafer. Different sensors also may be used for different tasks. For example, each gripping mechanism might use a through-beam type sensor to make sure the fingers are fully retracted, and might use a compact convergent-reflective type sensor to ensure the gripping mechanism has engaged the wafer. Methods of utilizing and monitoring such sensors are well known in the art and will not be discussed in detail herein. It should also be understood that any number of additional sensors and/or failsafe devices can be used as known in the art.

In order to minimize potential contamination of the wafer, the combs 304 of the load pads 300, 302 and the gripping mechanisms 306, 308 can be made out of an appropriate accepting material, such as a polyetherimide (PEI) material. One such material is Ultem®, available from General Electric Company of Fairfield, CT. Ultem® PEI is a high performance polymer that provides high strength and sufficient rigidity for wafer handling, while being a substantially clean material that is acceptable for wafer handling. The gripping mechanisms 306, 308 can be a primary source of contamination, due to the amount of movement within close proximity to the wafer. In order to minimize the potential for contamination, gripping mechanisms in accordance with one embodiment do not utilize pinned hinges as in existing gripping mechanisms. Instead, flexural hinges can be used that contain a super-elastic wire made from a material such as NITINOL. NITINOL is an acronym for Nickel Titanium Naval Ordnance Laboratory, and refers to a family of intermetallic materials that contain a nearly equal mix of nickel and titanium. NITINOL wires can be purchased, for example, from Nitinol Devices & Components of Fremont, CA. NITINOL is an extremely flexible material, which can take extremely high rates of strain and can bend back into shape, as NITINOL materials are said to have "shape memory." The super-elastic wire can be used instead of a pin, which is a sliding surface that can cause friction and/or lubrication related debris to contaminate the wafers. Such an approach can be used at all appropriate hinge points in the automation system. In certain systems, however, the gripping mechanisms can be located far enough from the wafer that the likelihood of contamination from the pin assemblies is acceptable. Further, pin assemblies can be more robust for certain systems, such that a pin assembly may be more desirable for the gripper assemblies. Flexible wires still can be used in other portions of the transfer arm assembly and/or slide table where a motion or rotation can occur.

For each of the motions of the automation system 100, any suitable actuator can be used as known and/or used in the art. It should be appreciated that any suitable mechanism for providing horizontal, vertical, rotational, and/or reciprocal motion of the various components can be used in accordance with embodiments of the present invention. For example, a linkage or robot arm configured to provide straight-line motion can be used to drive the slide table 108 in order to push a wafer into one of the combs 304. The various translation and/or rotation mechanisms also can be controlled in any suitable manner, such as by a microprocessor-based controller, as would be known in the art.

Figure 4:
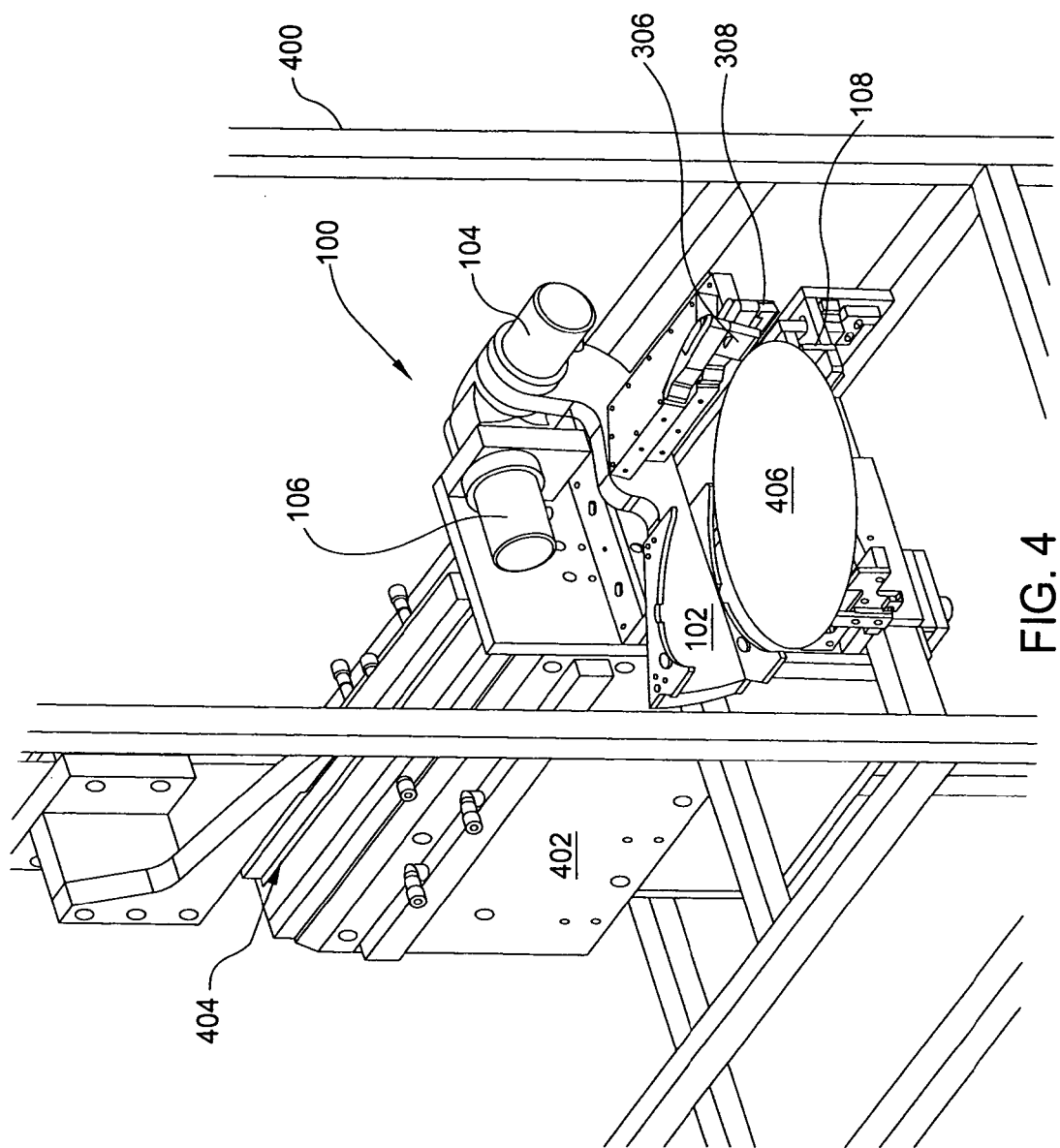
FIG. 4 is a perspective view diagram showing a step in a wafer transfer process using the wafer transfer mechanism of FIG. 1.

A process using such an automation device will be described with respect to FIGS. 4-12. Reference numbers will again be carried over where appropriate. In FIG. 4, the automation device 100 is shown attached to a framework 400 of a wafer processing system. The automation system is positioned adjacent to a wafer processing station 402, which in this case requires a wafer to be inserted vertically through a slot 404 in the top of the single wafer processing chamber 402. The shoulder rotation mechanism 106 is positioned such that when the transfer arm is rotated 90° to bring the wafer to a vertical orientation, the wafer is at an appropriate height to be grasped by an end effector (shown in FIG. 7) of the processing station 402. The wrist rotation mechanism 104 is positioned such that when the wafer is in a vertical orientation, the load pad containing the wafer can be rotated to be substantially planar with, and positioned directly above (or below), the slot of the wafer processing station 402. In the example of FIG. 4 it can be seen that a wafer to be processed 406, sometimes referred to in the industry as a "dirty" wafer, is positioned on the slide table 108 a distance from the load pads on the transfer arm 102. This wafer will be referred to herein as an "incoming" wafer, as the wafer is "incoming" with respect to the wafer processing chamber. The wafer can be placed substantially horizontally on the slide table using any appropriate automation known or used in the art, which can accept a wafer at any height and/or orientation. An advantage can be obtained in certain systems by positioning the slide table at approximately the same vertical position as that of a FOUP that could carry the wafers to a load port of the processing station, such that the swept volume needed to transferring a wafer to the slide table can be minimized, as well as the number of rotational axes and/or translations necessary to load the wafer. When loading a wafer onto the slide table, as well as when translating the slide table into position, both of the gripping mechanisms 306, 308 can be retracted in order to prevent a collision with the wafer.

Figure 5:
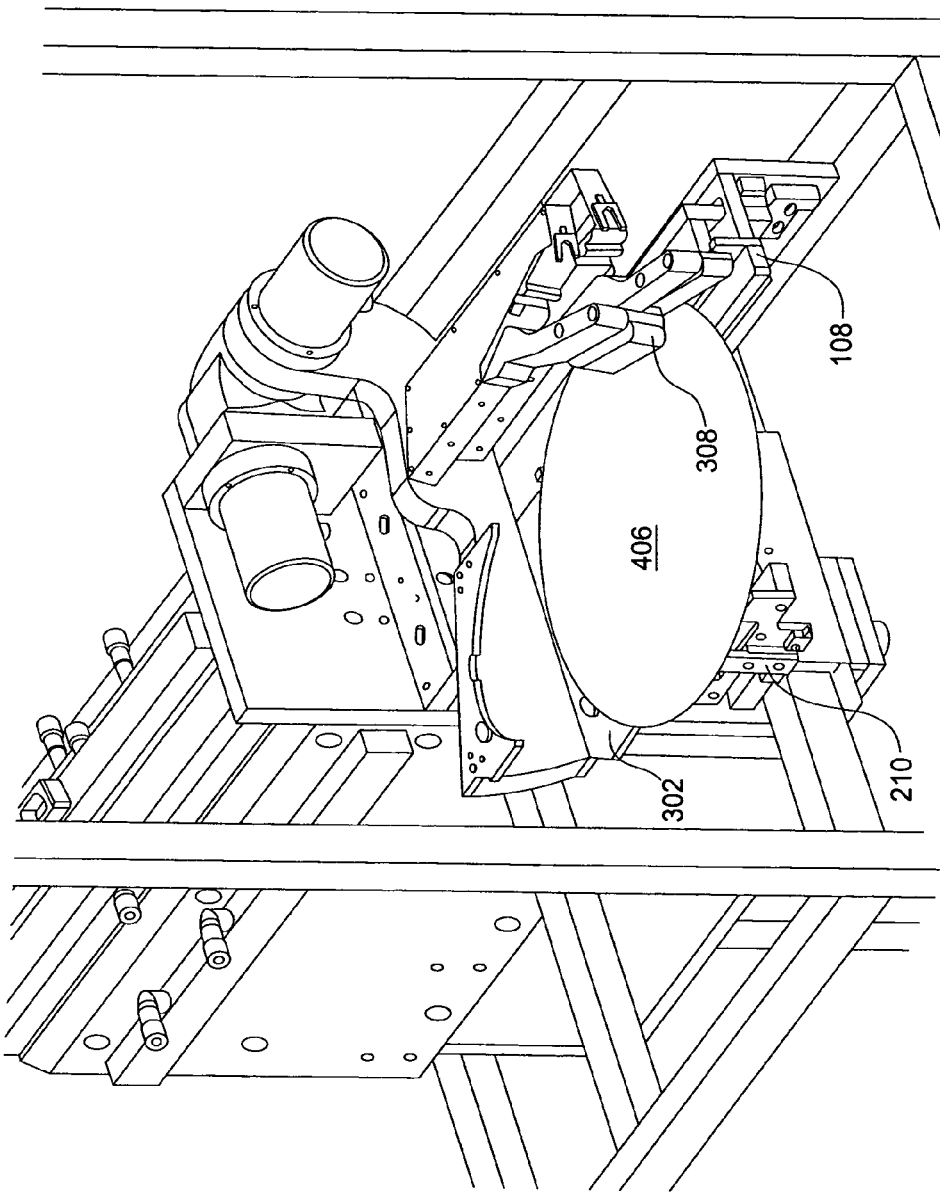
FIG. 5 is a perspective view diagram showing a subsequent step in a wafer transfer process using the wafer transfer mechanism of FIG. 1.

FIG. 5 shows the wafer 406 after the slide table has undergone a horizontal translation to push the edge of the wafer into the groove of one of the load pads 302. It should be understood that either load pad can be used to load the incoming wafer, the selected load pad determining the motions of the wrist and shoulder translation mechanisms. A sensor in the load pad 302, such as a pass-through sensor, can determine when the wafer is fully engaged by the groove in the load pad. For example, if the sensor is at the center point of the rounded edge of the load pad, the wafer will only reach that point when the wafer is fully seated in the rounded edge. A signal from the sensor can be sent to a central processor, system computer, or system relay device, whereby an engagement signal can be sent to the appropriate gripping mechanism 308. The gripping mechanism 308 then can gently grasp the edge of the wafer at a point substantially opposite a portion of the load pad. A sensor in the gripping mechanism 308 can determine when the wafer 406 is fully received and supported by the groove in the gripping mechanism 308. At this point, the wafer is still supported by the supporting members 202, 204, 206, 208 of the slide table 108. The latching mechanism 210 of the slide table is also in contact with the wafer 406, in order to prevent horizontal shifting of the wafer during engagement of the load pad and/or gripping mechanism. At this point in the process, the wafer is held both by the slide table 108 and the transfer arm assembly 102.

Figure 6:
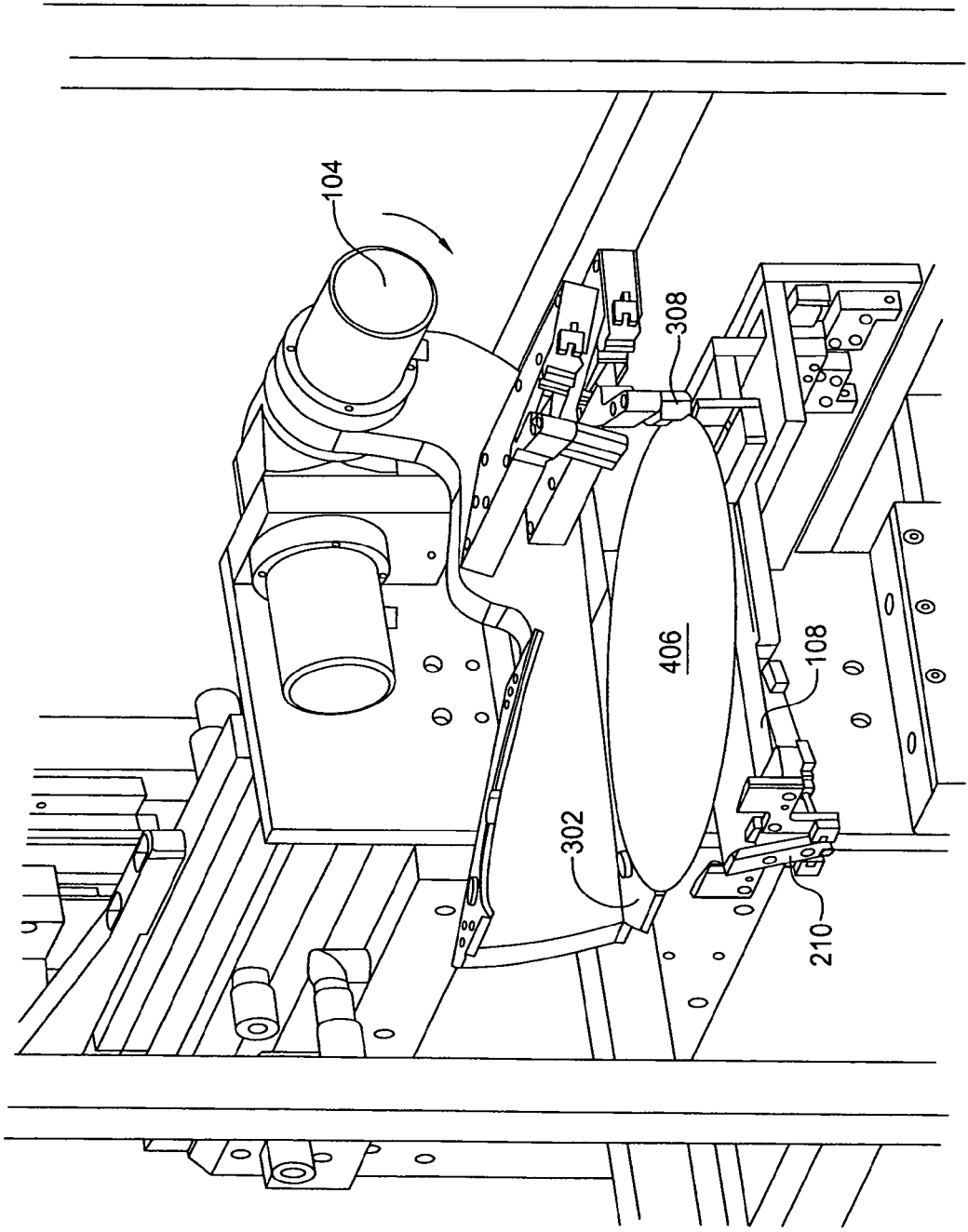
FIG. 6 is a perspective view diagram showing a subsequent step in a wafer transfer process using the wafer transfer mechanism of FIG. 1.

FIG. 6 shows the process after the latching mechanism 210 has moved away from the edge of the wafer. Once the latching mechanism is no longer contacting the wafer, the shoulder transfer mechanism 104 is able to rotate the wafer in the direction shown by the arrow, in order to lift the wafer from the sliding table. If the latching mechanism were not moved out of the way, as would be the case with existing static table supports, the latching mechanism could prevent the swinging of the wafer and/or cause a collision that could damage the wafer. In another embodiment, the latching mechanism might not move at all, or a latching member might not be used, whereby the slide table can be configured to translate horizontally and/or vertically as the wafer is being lifted by the transfer arm, such that the wafer does not collide with the supporting members as the wafer is being lifted from the slide table. A control algorithm can be used to coordinate the movement of the slide table with the transfer arm as would be known to one of ordinary skill in the art. In another embodiment, the slide table might not move at all, even to transfer a wafer into position where the wafer can be accepted by the transfer arm assembly. In this case, the latching member can be moveable, and/or the supporting members might allow for some variation in the horizontal positioning of the wafer. A latching mechanism also can simply be spring-loaded, such that the mechanism can be pushed out of the way by the wafer but still apply a small registering force to the wafer.

Once the wafer is lifted from the slide table 108, the wafer is supported completely by the grooves in the "incoming" load pad 302 and the "incoming" gripping mechanism 308. At this point, shoulder mechanism can continue to rotate until the wafer is positioned in a substantially vertical orientation. In an alternative embodiment, a slide table might not be used at all, with a transfer mechanism placing a wafer directly into the "incoming" load pad 302 and the "incoming" gripping mechanism 308. While this can be a somewhat simpler design, the lack of a slide table can require greater precision on the part of the transfer mechanism and the transfer arm assembly, as any slight variation in position can cause a collision with the wafer. Further, the use of a slide table can create a buffer for the overall process, whereby a wafer can wait in a queue for the availability of the transfer mechanism to remove the wafer from the slide table and transfer to external automation, for example.

Figure 7:
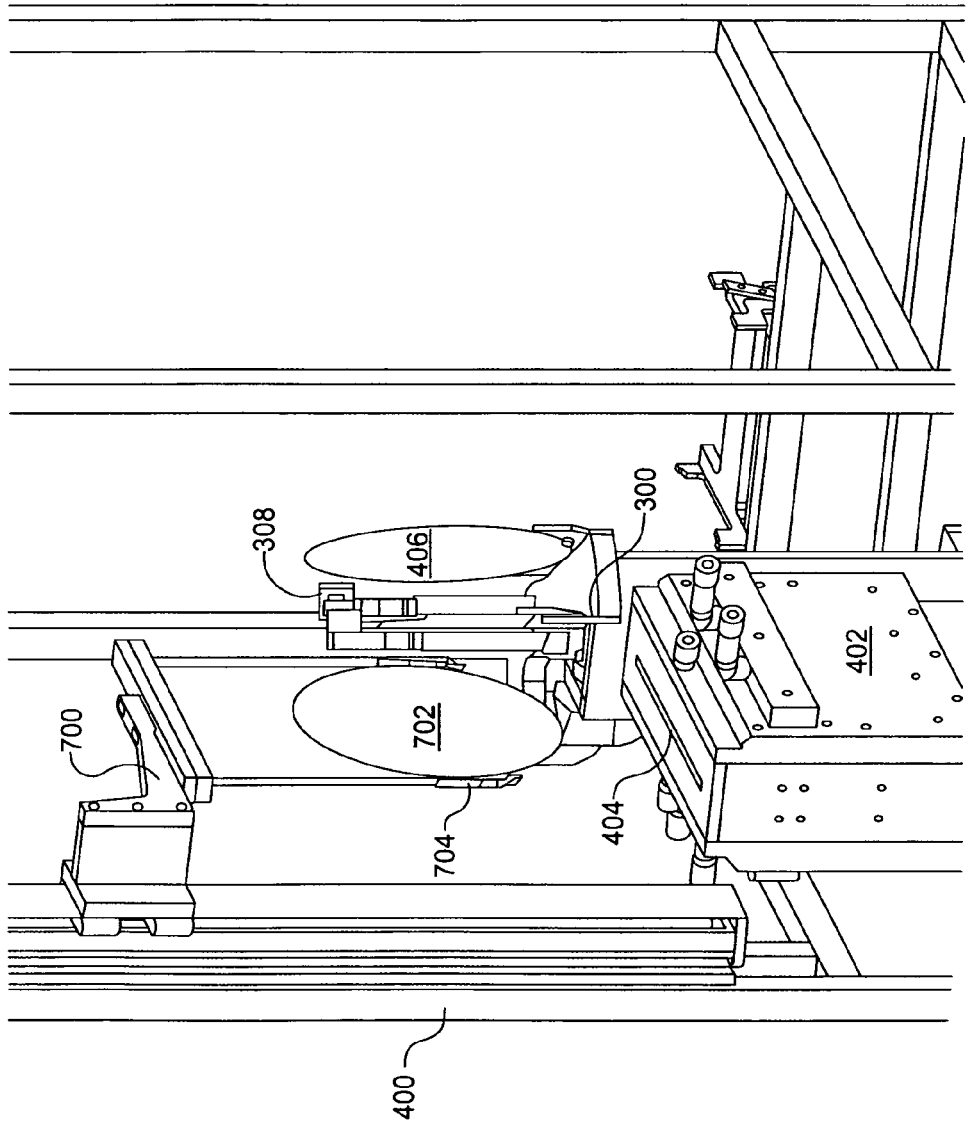
FIG. 7 is a perspective view diagram showing a subsequent step in a wafer transfer process using the wafer transfer mechanism of FIG. 1.

FIG. 7 shows the automation system after the shoulder rotation mechanism 104 has rotated the incoming wafer 406 to a vertical orientation, and after the wrist rotation mechanism 106 has rotated the transfer arm about a vertical axis such that the wafer undergoes an angular, horizontal motion. The wrist rotation brings a second or "outgoing" load pad 300 near the slot 404 of the single wafer processing station 402. A process elevator mechanism 700 is shown to have lifted a "clean" wafer 702 out of the processing station, the wafer having been processed and being ready to move to a subsequent station or carrier. This already-processed wafer will be referred to herein as an "outgoing" wafer, as the wafer is "outgoing" with respect to the processing chamber. The process elevator 700 holds the outgoing wafer 702 in a substantially vertical orientation above the processing station.

Figure 8:
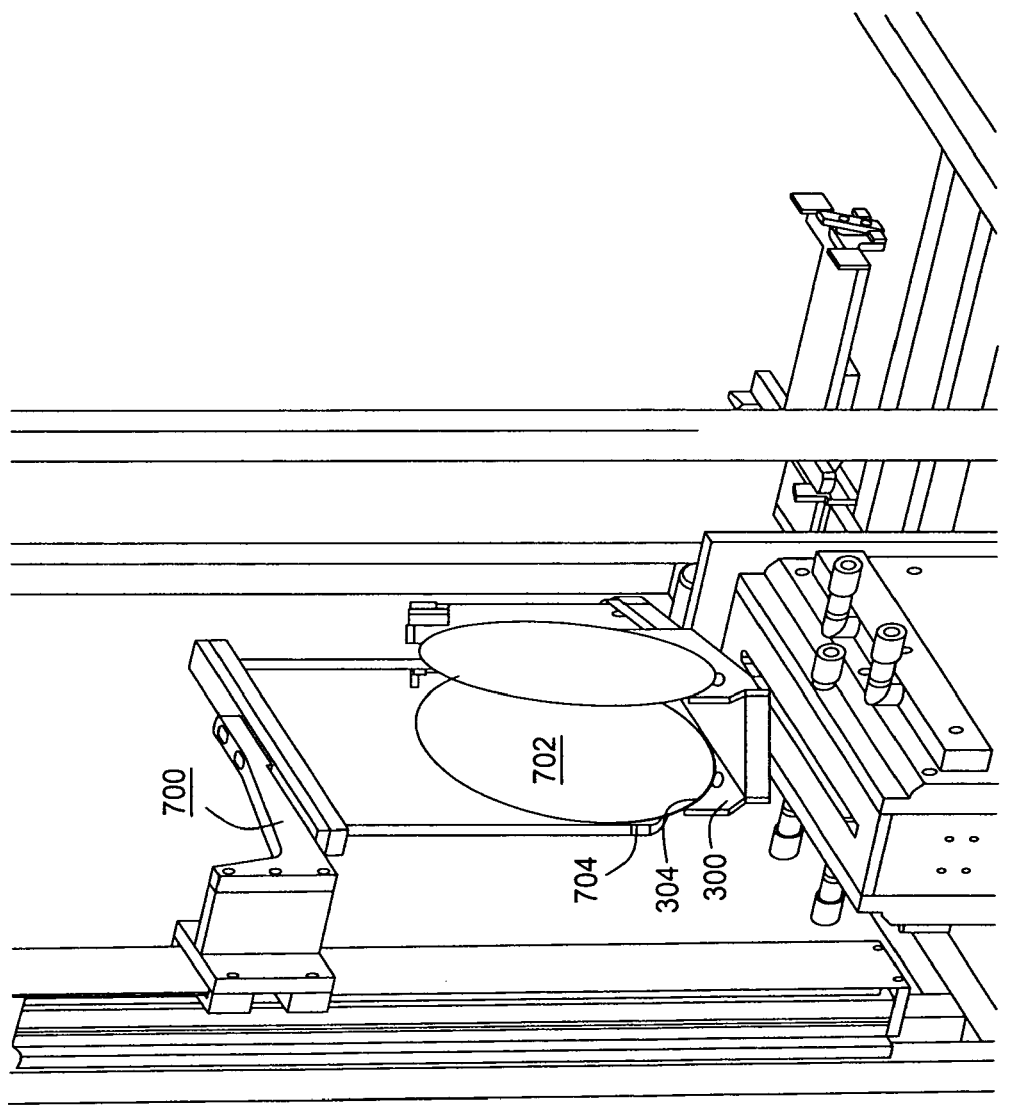
FIG. 8 is a perspective view diagram showing a subsequent step in a wafer transfer process using the wafer transfer mechanism of FIG. 1.

FIG. 8 shows the outgoing load pad 300 after further rotation of the wrist rotation mechanism 106, such that the outgoing load pad is substantially planar with the outgoing wafer 702. The load pad is positioned a safe distance from the outgoing wafer and from the processing chamber to prevent a collision. Once the outgoing load pad 300 is in position below the outgoing wafer 702, the wafer can be lowered into the groove 304 of the outgoing load pad 300. Once the wafer is supported by the load pad, the process end effectors 704 of the process elevator 700 can disengage from the wafer, such as by lowering past the edge of the wafer, whereby the wafer is supported only by the groove of the load pad 300. The groove therefore should be of sufficient dimension and strength to hold the wafer in a vertical orientation once the end effectors release. Before further rotation of the transfer arm, the incoming gripping mechanism 308 can disengage from the wafer, in order to allow the wafer to swing between the end effectors 704 of the elevator 700 without collision between the gripping mechanism and the end effectors 704. Further rotation can be dependent upon sensors indicating that the incoming gripping mechanism 308 has fully retracted. The incoming wafer is now fully supported by the groove in the incoming load pad 302.

Figure 9:
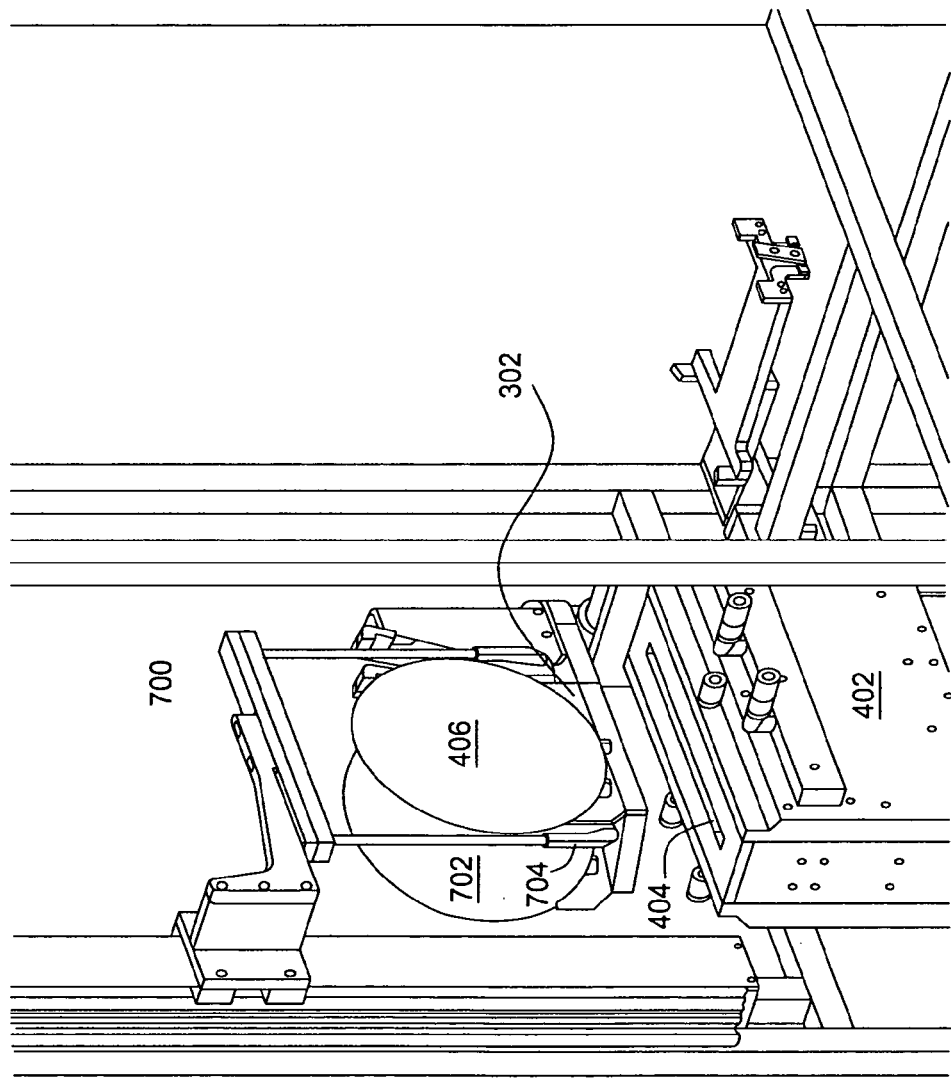
FIG. 9 is a perspective view diagram showing a subsequent step in a wafer transfer process using the wafer transfer mechanism of FIG. 1.
Figure 10:
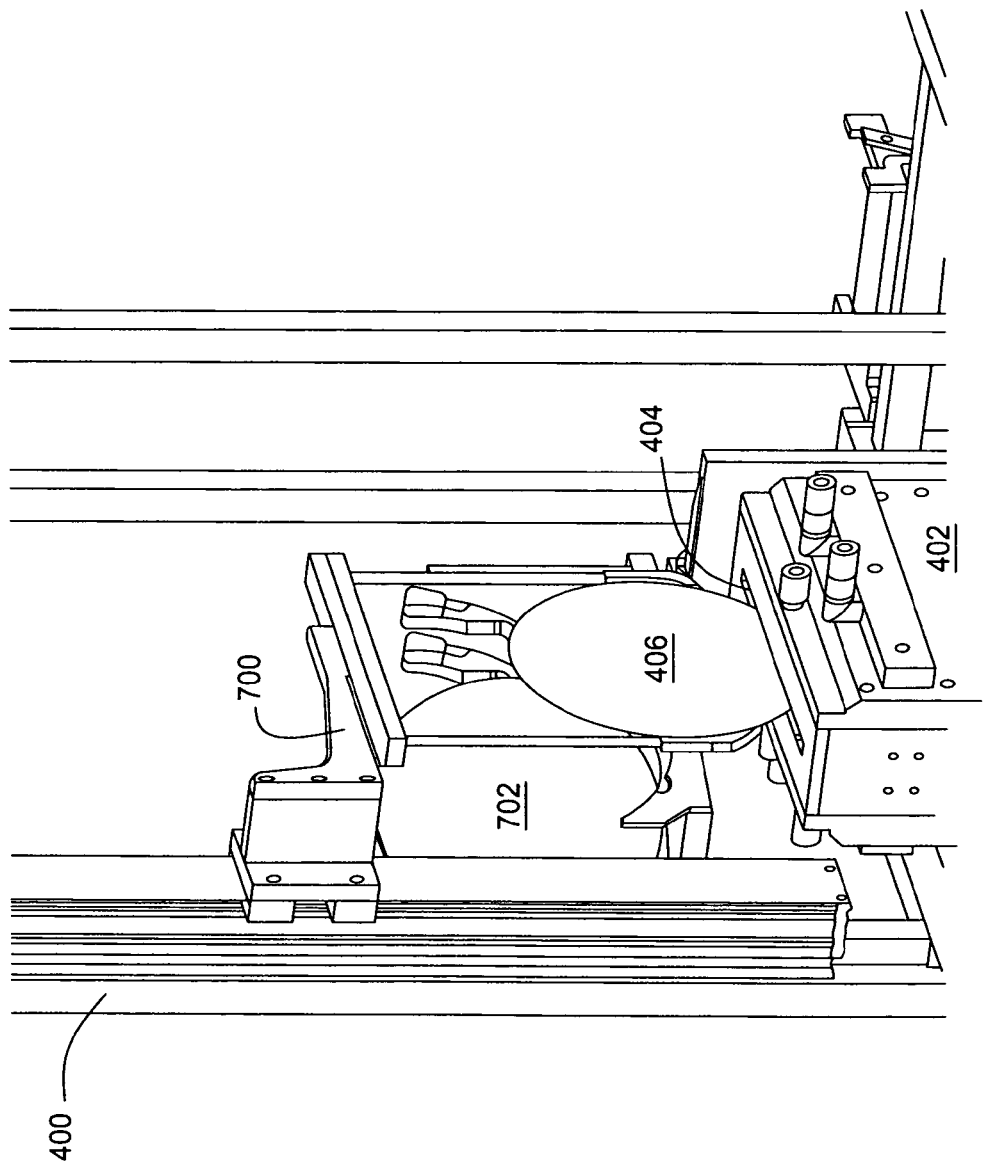
FIG. 10 is a perspective view diagram showing a subsequent step in a wafer transfer process using the wafer transfer mechanism of FIG. 1.

FIG. 9 shows the incoming load pad 302 being positioned planar with, and above, the wafer slot 404 of the processing chamber 402 after a further rotation of the wrist rotation mechanism (reference 106 in FIG. 3). After the outgoing wafer 702 is rotated free of the process elevator 700, the outgoing gripping mechanism 306 can grip the outgoing wafer such that the wafer is supported in both a horizontal and vertical direction. Since the incoming wafer is now positioned above the wafer slot 404, the process elevator 700 can lift until the end effectors 704 contact the edge of the incoming wafer 406. Once the end effectors are supporting the incoming wafer 406, the incoming wafer can be lifted from the incoming load port, such that the wrist rotation mechanism can swing the transfer arm out of the way of the process elevator 700. This is shown in FIG. 10. Once the transfer arm is out of the way, the process elevator can lower the incoming wafer 406 into the wafer slot 404 of the processing chamber 402. The process elevator 700 can be driven by any appropriate translation mechanism known or used in the art, and can take advantage of vertical portions of the system frame 400 as shown. It also should be recognized that other variations can be used with a similar two-axis motion, such as a system that utilizes only a single load pad on the transfer arm but two sets of end effectors, such as a pair of incoming end effectors and a pair of outgoing end effectors, on the processing chamber elevator.

Figure 11:
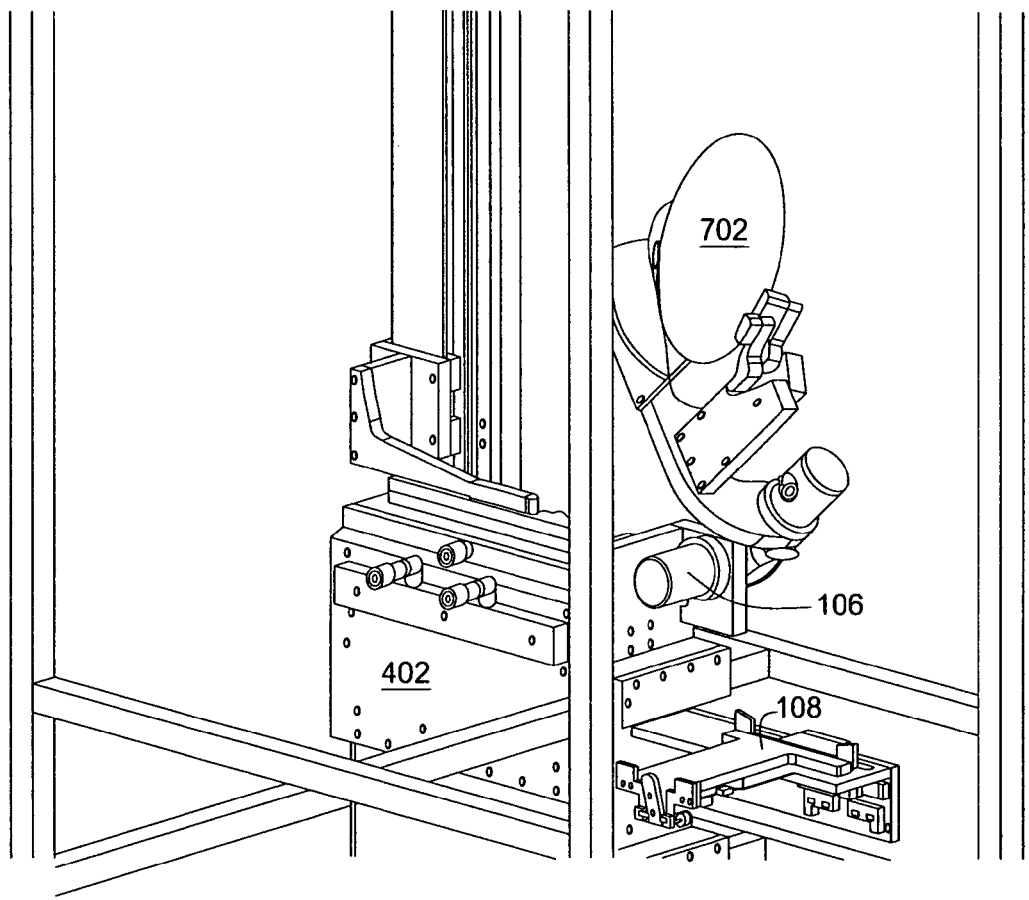
FIG. 11 is a perspective view diagram showing a subsequent step in a wafer transfer process using the wafer transfer mechanism of FIG. 1.
Figure 12:
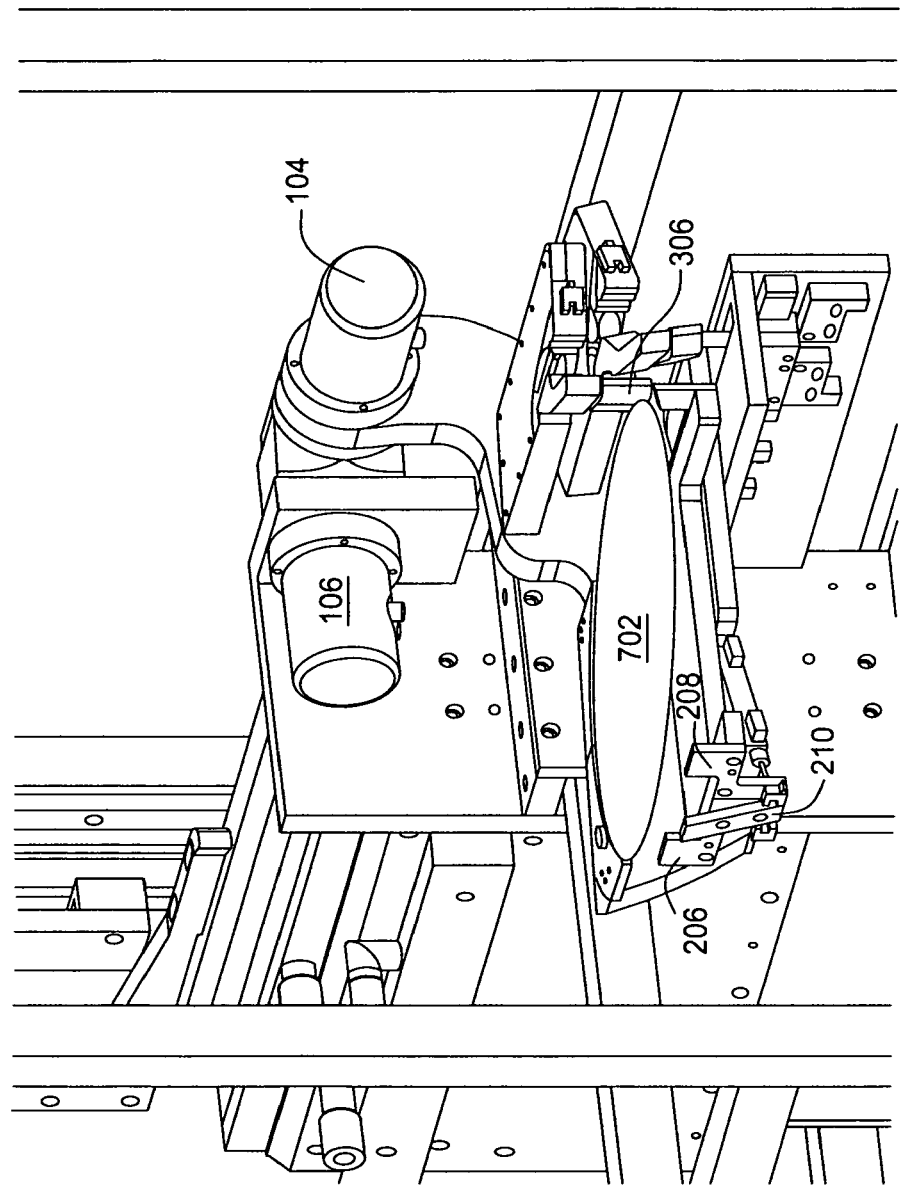
FIG. 12 is a perspective view diagram showing a subsequent step in a wafer transfer process using the wafer transfer mechanism of FIG. 1.

After the transfer arm is a safe distance from the elevator 700 and incoming wafer 406, the shoulder rotation mechanism 106 can begin to rotate the transfer arm with the outgoing wafer 702 away from the process chamber 402 and back toward the slide table 108 as shown in FIG. 11. After rotation by the shoulder mechanism 106, the wrist rotation mechanism 104 can rotate the outgoing wafer 702 back onto the support members 202, 204, 206, 208 of the slide table as shown in FIG. 12. After the wafer is supported on the support members, the latching mechanism 210 can move into position against the outgoing wafer 702, in order to prevent the wafer from sliding on the slide table support members. Now that the wafer is supported in the vertical and horizontal directions by the slide table, and is in a substantially horizontal orientation, the outgoing gripping mechanism 306 can disengage from the outgoing wafer 702, either by rotation or translation, such that the slide table 108 can slide the wafer out of the comb 304 of the outgoing load pad 300, and can move the wafer to a position where the wafer can be taken away by other process automation. At this point, the wrist rotation mechanism 104 can rotate the transfer arm such that the incoming load pad 302 is back in position to receive an incoming wafer. Although it is possible to use the outgoing load pad to receive an incoming wafer since the outgoing load pad is already in position, consistently using the incoming load pad to receive an incoming wafer allows for a constant set of translations and rotations for each wafer, as well as preventing contamination from "dirty" wafers from being passed to "clean" wafers by the load pads and gripping mechanisms.

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A wafer translation apparatus, comprising:
   a transfer arm including an incoming load pad for receiving an edge of an incoming wafer to be processed;
   an incoming gripping mechanism positioned on the transfer arm and capable of gripping the edge of the incoming wafer received in the incoming load pad, the incoming load pad and incoming gripping mechanism capable of releasably supporting the incoming wafer therebetween;
   a first rotational assembly capable of rotating the transfer arm about a first rotational axis such that the incoming wafer supported by the incoming load pad and incoming gripping mechanism can be rotated between a substantially horizontal orientation and a substantially vertical orientation;
   a second rotational assembly capable of rotating the transfer arm about a second rotational axis, the second rotational axis being orthogonal to the first rotational axis, wherein rotation of the transfer arm about the first and second rotational axes causes the incoming wafer to be translated from a first location and first orientation to a second location and second orientation; and
   a process elevator that is adapted to receive the incoming wafer positioned in the second location and the second orientation, wherein the process elevator is adapted to transfer the incoming wafer to a processing chamber.

2. An apparatus according to claim 1, wherein:
   the second location is oriented to align the wafer with a receiving slot of a wafer processing chamber.

3. An apparatus according to claim 1, wherein:
   the first location is a wafer support station.

4. An apparatus according to claim 1, wherein:
   The first orientation is a horizontal orientation and the second orientation is a vertical orientation.

5. An apparatus according to claim 1, further comprising:
   an outgoing load pad and outgoing gripping mechanism on the transfer arm, the outgoing load pad and outgoing gripping mechanism capable of releasably supporting an outgoing wafer therebetween.

6. An apparatus according to claim 1, wherein:
   the transfer arm is capable of being rotated by the first and second rotational assemblies such that the incoming wafer can be moved into position to be received by a wafer processing station, and an outgoing wafer having been processed can be extracted from the wafer processing station.

7. An apparatus according to claim 6, wherein:
   the transfer arm is further capable of being rotated by the first and second rotational assemblies to deliver the outgoing wafer to the first position and first orientation.

8. An apparatus according to claim 1, further comprising a slide table capable of receiving the incoming wafer from an automation system and sliding the incoming wafer into the first position by use of an actuator, wherein the incoming wafer can be received in the incoming load pad.

9. An apparatus according to claim 8, wherein:
   the slide table includes a latching mechanism capable of releasably contacting the edge of the incoming wafer, wherein the incoming wafer can be supported between the latching mechanism and at least two support members.

10. An apparatus according to claim 1, wherein:
    the incoming gripping mechanism is rotatably connected to the transfer arm using flexural hinges, each flexural hinge including an elastic wire.

11. An apparatus according to claim 10, wherein:
    the elastic wire is a NITINOL wire.

12. An apparatus according to claim 1, wherein:
    at least one of the incoming load pad and the incoming gripping mechanism includes a sensor for determining the presence of the incoming wafer.

13. An apparatus according to claim 1, wherein:
    each of the incoming load pad and incoming gripping mechanism includes a groove therein for accepting the edge of the incoming wafer.

14. An apparatus according to claim 13, wherein:
    at least the groove in each of the incoming load pad and incoming gripping mechanism is made of polytherimide accepting material.

15. The wafer translation apparatus of claim 1, wherein the processing chamber is oriented to process a wafer vertically.

16. A wafer translation apparatus, comprising:
    a transfer arm including an incoming load pad for receiving an edge of an incoming wafer to be processed;
    an incoming gripping mechanism positioned on the transfer arm and capable of gripping the edge of the incoming wafer received in the incoming load pad, the incoming load pad and incoming gripping mechanism capable of releasably supporting the incoming wafer therebetween;
    a first rotational assembly capable of rotating the transfer arm about a first rotational axis such that the incoming wafer supported by the incoming load pad and incoming gripping mechanism can be rotated between a substantially horizontal orientation and a substantially vertical orientation;
    a second rotational assembly capable of rotating the transfer arm about a second rotational axis, the second rotational axis being orthogonal to the first rotational axis, wherein rotation of the transfer arm about the first and second rotational axes causes the incoming wafer to be translated from a first location and first orientation to a second location and second orientation;
    an outgoing load pad and outgoing gripping mechanism on the transfer arm, the outgoing load pad and outgoing gripping mechanism capable of releasably supporting an outgoing wafer therebetween; and
    the outgoing and incoming load pads are skewed with respect to another at an angle of approximately 15°.

17. A translation apparatus for transferring a wafer to a processing station, comprising:
- a process elevator having a wafer receiving end effector, wherein the process elevator is adapted to transfer an incoming wafer to a processing station which is adapted to process a substrate in a vertical orientation;
- a transfer arm for receiving a plurality of wafers, wherein the transfer arm comprises:
   - an incoming load pad that is adapted to support the incoming wafer; and
   - an outgoing load pad that is adapted to support an outgoing wafer;
- a first rotational assembly capable of rotating the transfer arm about a first rotational axis such that the incoming wafer can be rotated between a substantially horizontal orientation and a substantially vertical orientation; and
- a second rotational assembly capable of rotating the transfer arm about a second rotational axis, wherein rotation of the transfer arm about the first and second rotational axes causes the incoming wafer to be translated from a first location and first orientation to a second location and second orientation, and the wafer is in position to be received by the end effector.

18. An apparatus according to claim 17, wherein:
the first orientation is a horizontal orientation and the second orientation is a vertical orientation.

19. An apparatus according to claim 17, wherein:
the transfer arm is capable of being rotated by the first and second rotational assemblies such that the incoming wafer can be moved into position to be received by the end effector, and an outgoing wafer having been processed can be extracted from the end effector.

20. A method for translating and rotating a wafer for processing, comprising:
- receiving the edge of an incoming wafer into an incoming load pad of a transfer arm;
- gripping the edge of the incoming wafer received in the incoming load pad with an incoming gripping mechanism, the incoming load pad and incoming gripping mechanism capable of releasably supporting the incoming wafer therebetween;
- rotating the transfer arm about a first rotational axis such that the incoming wafer supported by the incoming load pad and incoming gripping mechanism can be rotated between a substantially horizontal and a substantially vertical orientation;
- rotating the transfer arm about a second rotational axis, the second rotational axis being orthogonal to the first rotational axis, wherein rotation of the transfer arm about the first and second rotational axes causes the incoming wafer to be translated from an initial location and initial orientation to a transfer location and processing orientation;
- transferring the wafer from the incoming load pad to an end effector; and
- positioning the wafer disposed on the end effector in a desired position within a process chamber by use of a transferring mechanism.

21. A method according to claim 20, further comprising:
gripping the edge of an outgoing wafer between an outgoing gripping mechanism and an outgoing load pad of the transfer arm before rotating the incoming wafer into the processing location.

22. A method according to claim 20, further comprising:
releasing a latch mechanism of the slide table when the incoming wafer is releasably supported by the incoming load pad and incoming gripping mechanism.

23. A method for translating and rotating a wafer for processing, comprising:
- receiving a wafer on an incoming load pad coupled to a transfer arm assembly;
- rotating the transfer arm about a first rotational axis such that the wafer can be rotated between a substantially horizontal and substantially vertical orientation;
- rotating the transfer arm about a second rotational axis, the second rotational axis being orthogonal to the first rotational axis, wherein rotation of the transfer arm about the first and second rotational axes causes the wafer to be translated from an initial location and horizontal orientation to a transfer location and vertical orientation;
- transferring the wafer from the incoming load pad to an end effector;
- positioning the wafer disposed on the end effector in a desired position within a vertically oriented process chamber by use of a transferring mechanism; and
- transferring the wafer from the end effector to an outgoing load pad coupled to the transfer arm assembly.

24. The method according to claim 23, further comprising:
- transferring the wafer from the outgoing load pad to one or more supports;
- engaging the wafer with a latch mechanism when the wafer is disposed on the one or more supports.

25. The method according to claim 20, wherein the processing orientation is a vertical orientation.

26. The wafer translation apparatus of claim 20, further comprising orienting the processing chamber to process a wafer vertically.

* * * * *